US007005334B2

(12) United States Patent
Brown et al.

(10) Patent No.: US 7,005,334 B2
(45) Date of Patent: Feb. 28, 2006

(54) ZERO THRESHOLD VOLTAGE PFET AND METHOD OF MAKING SAME

(75) Inventors: Jeffrey S. Brown, Middlesex, VT (US); Chung H. Lam, Williston, VT (US); Randy W. Mann, Poughquag, NY (US); Jeffery H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/845,835

(22) Filed: May 14, 2004

(65) Prior Publication Data

US 2004/0251475 A1    Dec. 16, 2004

Related U.S. Application Data

(62) Division of application No. 10/250,190, filed on Jun. 11, 2003, now Pat. No. 6,825,530.

(51) Int. Cl.
*H01L 21/336* (2006.01)
(52) U.S. Cl. .................. 438/197; 438/521; 438/524; 438/528; 438/529; 438/697; 438/199; 438/400
(58) Field of Classification Search ................ 438/521, 438/524, 528, 529, 697, 400, 199
See application file for complete search history.

(56) References Cited

U.S. PATENT DOCUMENTS

| 5,773,863 A | 6/1998 | Burr et al. ............... 257/344 |
| 5,780,912 A | 7/1998 | Burr et al. ............... 257/408 |
| 5,985,727 A | 11/1999 | Burr ........................ 438/302 |
| 6,093,951 A | 7/2000 | Burr ........................ 257/408 |
| 6,110,783 A | 8/2000 | Burr ........................ 438/286 |
| 6,121,666 A | 9/2000 | Burr ........................ 257/408 |
| 6,489,224 B1 | 12/2002 | Burr ........................ 438/526 |
| 6,566,204 B1 | 5/2003 | Wang et al. .............. 438/286 |
| 6,583,060 B1 * | 6/2003 | Trivedi .................... 438/700 |
| 6,624,445 B1 | 9/2003 | Miyanaga et al. ......... 257/288 |
| 2003/0203550 A1 * | 10/2003 | Lai et al. |

FOREIGN PATENT DOCUMENTS

JP        2000150668        5/2000

* cited by examiner

*Primary Examiner*—Mai-Huong Tran
(74) *Attorney, Agent, or Firm*—Downs Rachlin Martin PLLC

(57) ABSTRACT

A zero threshold voltage (ZVt) pFET (104) and a method of making the same. The ZVt pFET is made by implanting a p-type substrate (112) with a retrograde n-well (116) so that a pocket (136) of the p-type substrate material remains adjacent the surface of the substrate. This is accomplished using an n-well mask (168) having a pocket-masking region (184) in the aperture (180) corresponding to the ZVt pFET. The n-well may be formed by first creating a ring-shaped precursor n-well (116') and then annealing the substrate so as to cause the regions of the lower portion (140') of the precursor n-well to merge with one another to isolate the pocket of p-type substrate material. After the n-well and isolated pocket of p-type substrate material have been formed, remaining structures of the ZVt pFET may be formed, such as a gate insulator (128), gate (132), source (120), and drain (124).

17 Claims, 4 Drawing Sheets

ZERO THRESHOLD VOLTAGE PFET AND METHOD OF MAKING SAME

RELATED APPLICATION

This application is a divisional of U.S. application Ser. No. 10/250,190 filed Jun. 11, 2003 now U.S. Pat. No. 6,825,530, and incorporated by reference herein.

FIELD OF THE INVENTION

The present invention relates generally to the field of semiconductors. More particularly, the present invention is directed to a zero threshold voltage pFET and a method of making the same.

BACKGROUND OF THE INVENTION

Zero, or low, threshold voltage (ZVt) devices are useful in various types of integrated circuits (ICs). For example, ZVt field-effect transistors (FETs) are desirable in certain applications because of their high switching speed and low saturation voltage. ZVt FETs are useful in analog circuits, e.g., amplifiers and power supplies, and in digital circuits, e.g., for power supply decoupling in logic circuits, among other uses.

In the manufacture of semiconductor ICs, processing often begins with a p-doped wafer. Due to this p-doping, it is a relatively simple matter to form ZVt nFETs without the need to provide any masks in addition to the masks used to form the implanted wells of standard threshold voltage (Std-Vt) FETs. Since there are no additional costs needed for additional masks with respect to ZVt nFETs, Zvt nFETs may be called "free" devices. However, using conventional processing techniques, ZVt pFETs are not free devices, since they would have to be made using an additional counter-doping mask that would not be needed to form the n-well of a Std-Vt pFET. This is illustrated in FIGS. 1 and 2. FIG. 1 illustrates the step of forming a conventional n-well 20 in a p-type substrate 24 using a typical n-well mask 28. After n-well 20 is formed, a Std-Vt pFET 32 may be made by forming shallow trench isolators (STIs) 36, gate insulator 40, gate 44, source 48, and drain 52, among other things, using conventional techniques.

As shown in FIG. 2, if a ZVt pFET 56 were desired under conventional thinking, n-well 20 of FIG. 1 would have to be counterdoped to form a counterdoped region 60 beneath gate 44' that would become the channel of the ZVt PFET. After the counterdoping has been performed, the other structures of ZVt pFET 56, e.g., shallow trench isolators (STIs) 36', gate insulator 40', gate 44', source 48', and drain 52', among other things, may be formed using conventional techniques. This counterdoping of n-well 20 requires an additional mask 64 to mask regions of substrate 24 where counterdoping is unwanted, e.g., at all regions other than the regions of the ZVt pFETs. This additional mask 64 and associated wafer processing adds to the cost of an IC. Due to these additional costs, ZVt pFETs are not free devices. Since ZVt pFETs are not free devices, IC designers generally avoid using them. It would be beneficial if there were a method of making ZVt pFETs without additional mask and associated processing costs.

SUMMARY OF THE INVENTION

An integrated circuit comprising a device that includes a substrate made of a material. The substrate includes a surface, an implanted well having a first dopant type and a lower portion distal from the surface. A pocket consisting of the material is formed within the implanted well between the lower portion of the implanted well and the surface of the substrate. An insulator is located proximate the surface of the substrate above the pocket. An electrode is located proximate the insulator and is located substantially in registration with the pocket.

A method of forming an integrated circuit device on a substrate made of a material and having a surface. The method comprises the step of providing a mask to the substrate that protects a pocket of the substrate adjacent the surface of the substrate. An implanted well is formed so that the implanted well isolates the pocket. An insulator is formed proximate the surface of the substrate above the pocket. An electrode is formed proximate the insulator above the pocket.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 1:
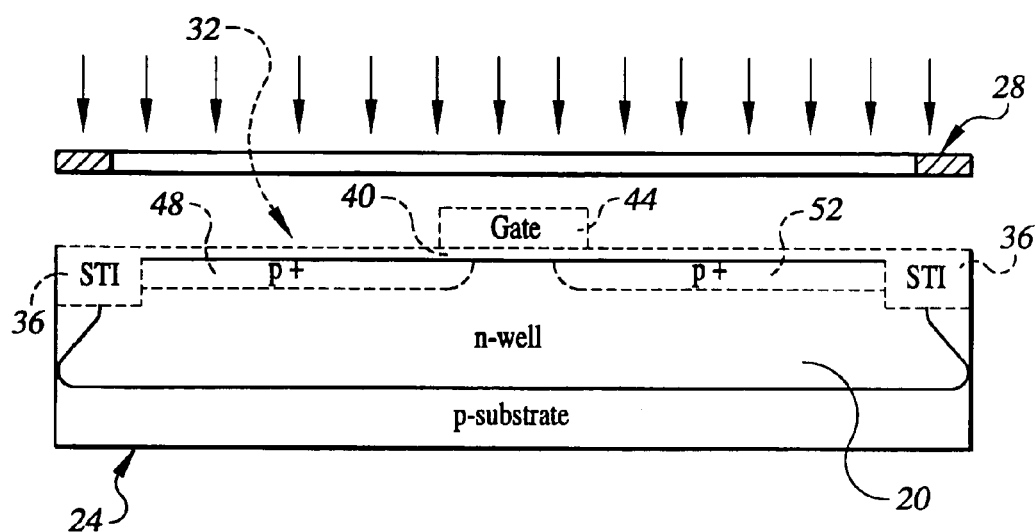
FIG. 1 is a cross-sectional view of a prior art Std-Vt pFET illustrating the step of forming an n-well in a substrate.
Figure 2:
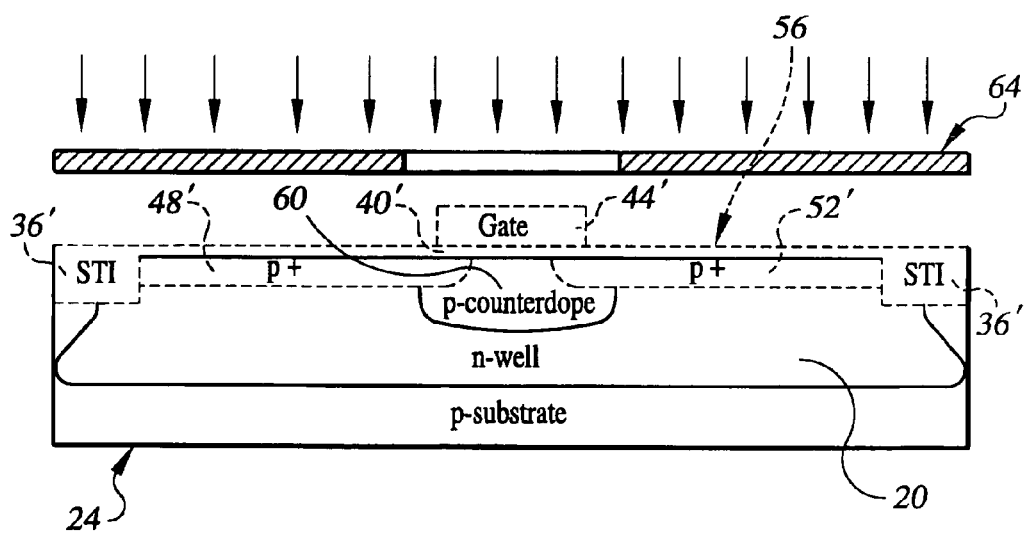
FIG. 2 is a cross-sectional view of the Std-Vt pFET of FIG. 1 illustrating the step of counterdoping the n-well in order to form a prior art lower-Vt pFET.
Figure 3:
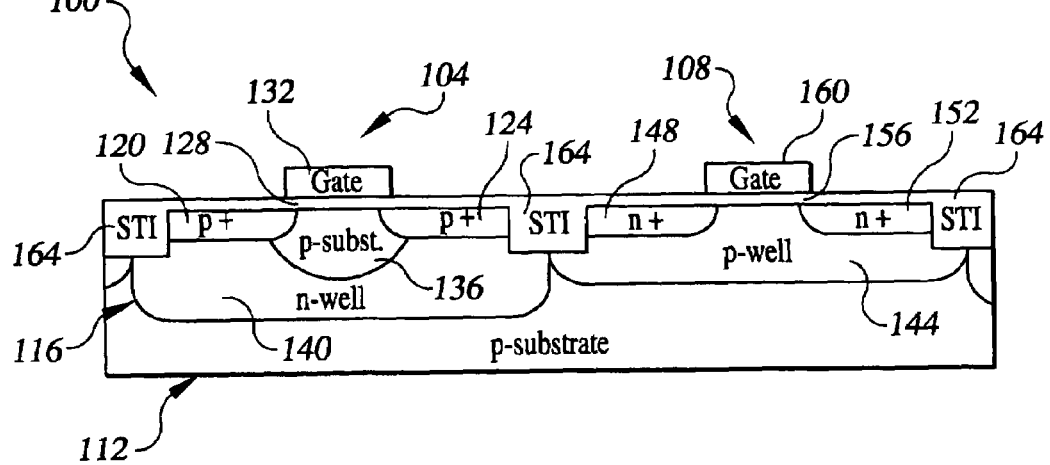
FIG. 3 is a cross-sectional view of an integrated circuit that includes a conventional nFET and a ZVt pFET of the present invention.

FIG. 3 shows in accordance with the present invention an integrated circuit (IC), denoted generally by the numeral 100. Importantly, IC 100 includes a unique zero, or low, threshold voltage (ZVt) pFET 104 that, as described below, can be made without any masks in addition to the masks that would otherwise be used in forming the various devices of the IC. As those skilled in the art will appreciate, IC 100 may have any type and number of devices, e.g., capacitors, standard threshold voltage (Std-Vt) FETs, and ZVt nFETs, among others, appropriate for the application of the IC. However, for convenience, only a small portion of IC 100 is shown to illustrate the inventive method of forming ZVt pFET 104. Also for convenience, ZVt pFET 104 is shown proximate a Std-Vt nFET 108 to illustrate the making of the ZVt pFET in conjunction with another device. Those skilled in the art will understand that generally only basic components of ZVt pFET 104 and Std-Vt nFET 108 are shown. Components not shown, e.g., insulating layers, contacts, and conductors, are well known in the art and do not need to be shown for those skilled in the art to understand the scope of the present invention.

IC 100 generally includes a substrate 112, such as a p-doped wafer or combination of one or more epitaxial layers and a wafer, that provides the basic structure of ZVt pFET 104 and Std-Vt nFET 108. ZVt pFET 104 includes an n-well 116, a source 120, a drain 124, a gate insulator 128, a gate 132, and a pocket 136 of p-substrate material located between the gate and the lower portion 140 of the n-well. The formation of pocket 136 is an important aspect of the present invention, since this may be accomplished without additional masks. Thus, ZVt pFET 104 may be considered a "free device," as described in the background section above. Std-Vt nFET 108 may be a conventional nFET that includes a p-well 144, a source 148, a drain 152, a gate insulator 156, and a gate 160. STIs 164 may be provided around ZVt pFET 100 and Std-Vt nFET 108 as needed to isolate the regions of these devices from one another and other surrounding devices (not shown). STIs 164 may be formed using any of the well-known methods practiced in the art. As those skilled in the art will appreciate, STIs 164 may be formed before or after well implanting is performed.

Figure 4:
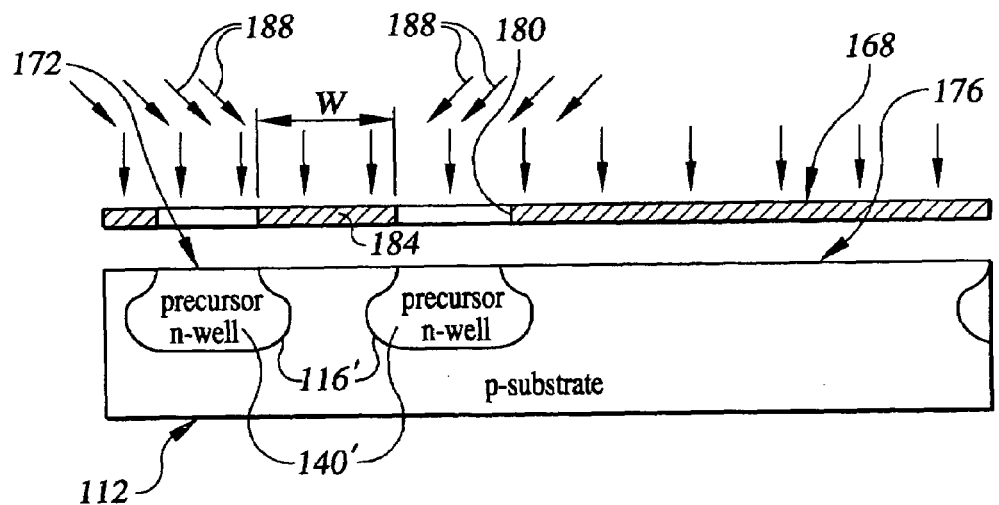
FIG. 4 is a cross-sectional view of the integrated circuit of FIG. 3 during its manufacture, showing the creation of a precursor n-well ring in the substrate for the ZVt PFET.

FIGS. 4–9 illustrate various steps in the formation of IC 100 (FIG. 3) and, particularly, ZVt pFET 104. Referring to FIG. 4, an n-well mask 168 may be used to implant substrate 112 with a generally ring-shaped precursor n-well 116' in the region 172 of ZVt pFET 104 (FIG. 3). All other regions not receiving an n-well implant, e.g., region 176 of nFET, are masked by n-well mask 168. To create ring-shaped precursor n-well 116', n-well mask 168 includes a generally ring-shaped aperture 180, the inner periphery of which is defined by a "pocket-masking region" 184 that masks the central portion of ZVt pFET region 172 so as to allow the formation of pocket 136 (FIG. 3) of un-implanted substrate material beneath gate 132. After n-well mask 168 has been properly registered with respect to substrate 112, the substrate is implanted by bombarding it with suitable n-type dopant atoms in any manner known in the art. It is not necessary to describe implantation techniques in any detail, since such techniques are widely known in the art.

Although not shown, wherever Std-Vt pFETs are desired, n-well mask 168 would include conventional n-well apertures. Generally, an aperture for forming ZVt pFET 104 is the same as a conventional n-well aperture, but with pocket-masking region 184, for creating pocket 136 (FIG. 3) during formation of n-well 140. As will be readily appreciated by those skilled in the art, all that is generally required to form n-well 140 and pocket 136 of ZVt pFET 104 is to add a pocket-masking region 184 to a conventional n-well mask for each ZVt pFET desired. Therefore, no additional masks are needed to form ZVt pFET 104 relative to the number of masks needed to form Sdt-Vt FETs, such as nFET 108, and ZVt nFETs.

Figure 5:
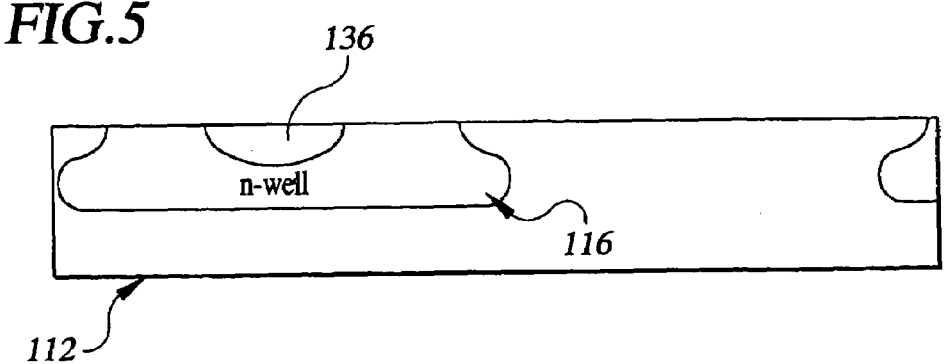
FIG. 5 is a cross-sectional view of the integrated circuit of FIG. 3 during its manufacture, showing the merging of the lower portion of the precursor n-well to form a pocket of p-substrate material beneath the gate of the ZVt pFET.

As can be seen in FIG. 4, n-well 116 (FIG. 3) may be formed by implanting precursor ring-shaped n-well 116' as a retrograde well. Precursor n-well 116' generally spreads out in cross-section as the dopant concentration increases with depth. However, the spreading is typically not so great that lower portion 140' of precursor n-well 116' becomes continuous underneath pocket-masking region 184 of n-well mask 168. This is most often true when implantation is performed normal to the surface of substrate 112. One way to cause regions of lower portion 140' of precursor n-well 116' to merge with one another to form continuous n-well 116 of FIG. 3 is to subject substrate 112 to annealing temperatures in a manner known in the art. This annealing process causes doping atoms in precursor n-well 116' to diffuse laterally, causing regions of lower portion 140' to spread and merge with one another to form pocket 136 of original substrate material above the bottom of the now-continuous n-well 116. Merged n-well 116 is shown in FIG. 5.

Depending upon the width W of pocket-masking region 184, the depth of n-well 116, and dopant concentration in the lower portion 140 of the n-well, among other variables, skewed implantation may be used to supplement annealing or to eliminate the need to anneal substrate. As is readily apparent, implanting dopant atoms at an angle skewed from normal may be used to implant these atoms farther underneath pocket-masking region 184 of n-well mask 168 than implantation performed normal to the surface of substrate 112 could achieve. If width W of pocket-masking region 184 is small enough and the angle of implantation is large enough with respect to a normal from the surface of substrate 112, implantation may be great enough that atoms implanted from one side of the pocket-masking region may extend into the region doped with atoms implanted from the opposite side of the pocket-masking region, particularly when implantation is performed at multiple angles in opposing directions. These skewed implantations are represented by arrows 188 in FIG. 4. It is noted that width W of pocket-masking region 184 is dependent upon a number of variables, such as the width of gate 132 (FIG. 3) and method of implantation, among others. While these variables exist, it is well within ordinary skill in the art to determine suitable values for these variables without undue experimentation. Therefore, a detailed presentation of interrelation of these variables and an exhaustive list of parameters are not required for those skilled in the art to practice the full scope of the present invention, as defined by the appended claims.

Figure 6:
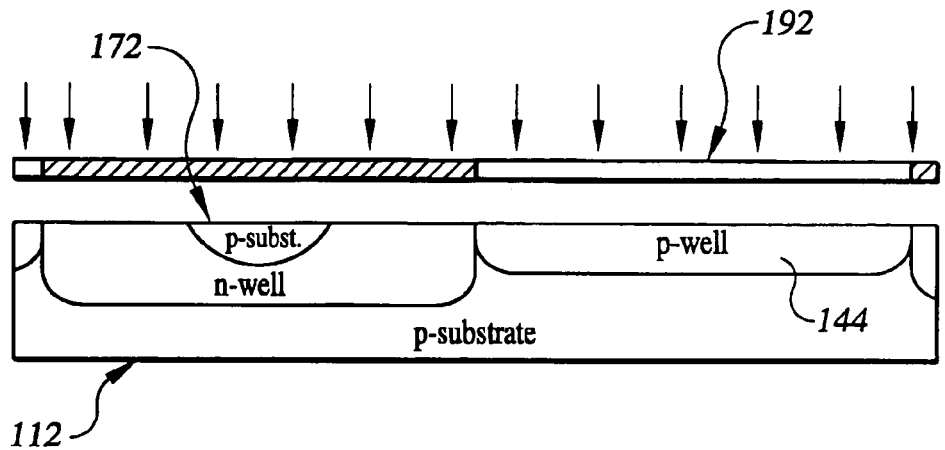
FIG. 6 is a cross-sectional view of the integrated circuit of FIG. 3 during its manufacture, showing the formation of a p-well for the nFET.
Figure 7:
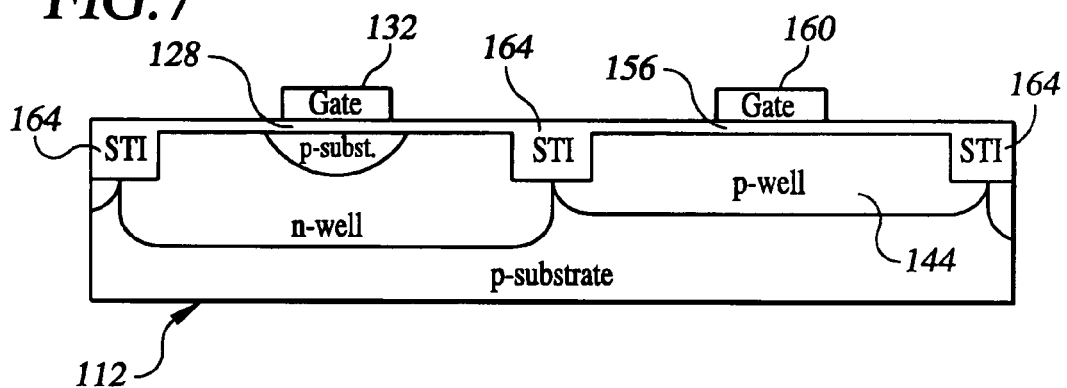
FIG. 7 is a cross-sectional view of the integrated circuit of FIG. 3 during its manufacture, showing the formation of shallow trench insulators, gate insulators, and gates for the ZVt pFET and nFET.
Figure 8:
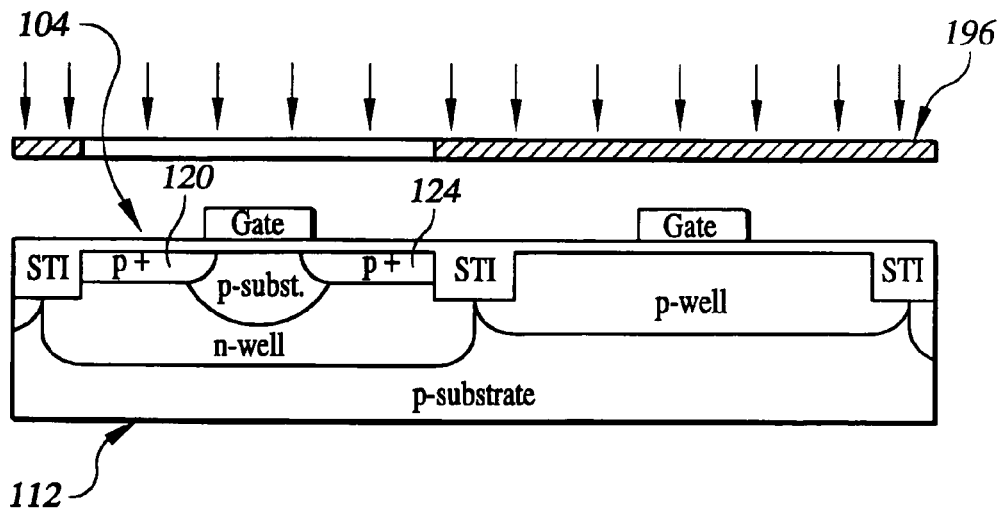
FIG. 8 is a cross-sectional view of the integrated circuit of FIG. 3 during its manufacture, showing the formation of the source and drain of the ZVt pFET.
Figure 9:
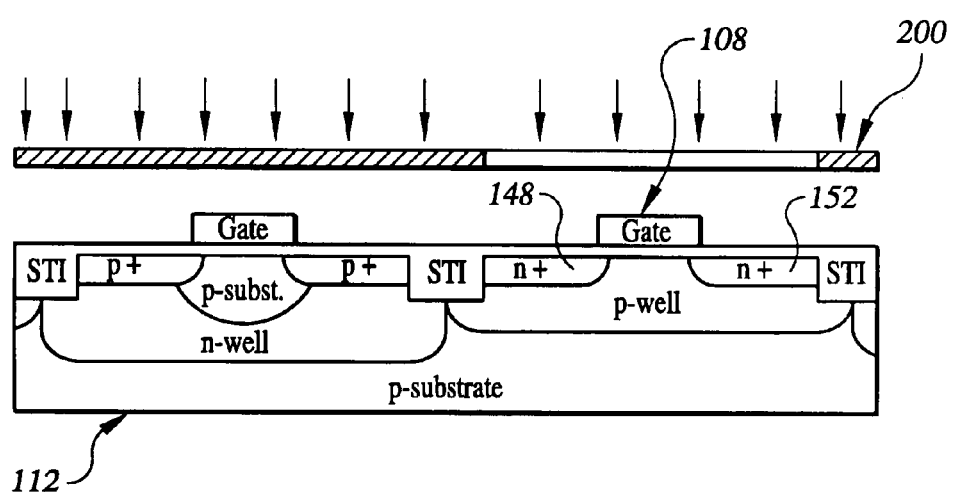
FIG. 9 is a cross-sectional view of the integrated circuit of FIG. 3 during its manufacture, showing the formation of the source and drain of the nFET.

After merged n-well 116 has been formed, substrate 112 may be further processed to form the remaining structures of ZVt pFET 104 and Std-Vt nFET 108. For example, FIG. 6 illustrates the formation of p-well 144 of Std-Vt nFET 108 (FIG. 3) using a p-well mask 192 to mask all regions of substrate 112 where p-doping is not desired, e.g., at region 172 of ZVt pFET 104. Once p-well mask 192 has been positioned properly, substrate 112 is implanted with suitable p-type dopant atoms in a manner known in the art. FIG. 7 illustrates several steps performed subsequent to the formation of p-well 144. STIs 164 and gate insulators 128, 156 may be formed, followed by the formation of polysilicon gates 132, 160 (electrodes). Each of these steps may be performed in any manner known in the art. Since the techniques used to form these structures are well-known in the art, they need not be described herein. FIGS. 8 and 9 show, respectively, the doping of substrate 112 to form, respectively, source 120 and drain 124 of ZVt pFET 104 and source 148 and drain 152 of Std-Vt nFET 108 utilizing a ZVt pFET source and drain mask 196 and an Std-Vt nFET source and drain mask 200. Sources 120, 148 and drains 124, 152 may be formed using conventional masking and implantation techniques.

Although the invention has been described with respect to forming a ZVt pFET 104 on a p-doped substrate 112, those skilled in the art will readily appreciate that a ZVt nFET may similarly be formed on a n-doped substrate. In addition, those skilled in the art will understand that IC devices other than ZVt FETs, e.g., ZVt capacitors, may be made in accordance with the present invention. A ZVt capacitor is similar to a ZVt FET but would have a larger "gate" electrode and no source (or drain).

While the present invention has been described in connection with a preferred embodiment, it will be understood that it is not so limited. On the contrary, it is intended to cover all alternatives, modifications, and equivalents as may be included within the spirit and scope of the invention as defined above and in the claims appended hereto.

What is claimed is:

1. A method of forming an integrated circuit device on a substrate made of a material and having a surface, comprising the steps of:
   a) providing a mask to the substrate that protects a pocket of the substrate adjacent the surface of the substrate;
   b) forming an implanted well so that said implanted well isolates said pocket;
   c) forming an insulator proximate the surface of the substrate above said pocket; and
   d) forming an electrode proximate said insulator above said pocket.

2. A method according to claim 1, wherein said implanted well has a lower portion and step b includes forming a ring-shaped precursor well and annealing the substrate so that regions of said lower portion merge with one another so as to isolate said pocket.

3. A method according to claim 1, wherein step b includes implanting atoms at one or more angles skewed with respect to a normal from the surface of the substrate.

4. A method according to claim 1, wherein the integrated circuit device is a ZVt FET.

5. A method according to claim 4, wherein the ZVt FET is a pFET.

6. A method according to claim 1, wherein said electrode is a gate.

7. A method according to claim 6, further comprising the steps of forming a source and a drain in the substrate.

8. A method according to claim 1, wherein the substrate is a wafer.

9. A method according to claim 1, wherein the material is p-doped silicon and said implanted well is an n-well.

10. A method according to claim 1, wherein step b) is at least partially performed using said mask.

11. A method according to claim 1, wherein said pocket has a center and step d) comprises forming said electrode substantially over said center.

12. A method of forming an integrated circuit having a plurality of Std-Vt FETs and a plurality of ZVt FETs on a doped substrate, comprising the steps of:
   a) providing a mask to the doped substrate for protecting a plurality of first areas in which Std-Vt FETs are to be formed and for protecting a pocket within each of a plurality of second areas in which ZVt FETs are to be formed;
   b) forming an implanted well within the substrate at each area other than said first and second areas, said implanted well isolating a corresponding respective said pocket; and
   c) forming a gate insulator and a gate in each of said second areas above said corresponding respective pockets.

13. A method according to claim 12, wherein each of said implanted wells has a lower portion and step b includes forming a plurality of ring-shaped precursor wells and annealing the substrate so that regions of said lower portions merge with one another so as to isolate said pockets.

14. A method according to claim 12, wherein step b includes implanting atoms at one or more angles skewed with respect to a normal from a surface of the substrate.

15. A method according to claim 12, further comprising the steps of forming a source and a drain in each of said second areas.

16. A method according to claim 12, wherein step b) is at least partially performed using said mask.

17. A method according to claim 12, each said pocket includes a center and step c) includes forming said gate insulator and said gate substantially over said center.

* * * * *